United States Patent [19]
Slootman et al.

[11] Patent Number: 5,952,108
[45] Date of Patent: Sep. 14, 1999

[54] SILICON OXIDE ON A SUBSTRATE

[75] Inventors: Frank Slootman, Saint Cyr l'Ecole; Pascal Bouard, Fontenay le Fleury; François Coeuret, Guyancourt, all of France; Eckhard Prinz, Hamfelde, Germany; Dominique Jouvaud, Paris, France

[73] Assignee: L'Air Liquide, Societe Anonyme pour l'Etude et l'Exploitation des Procedes Georges Claude, Paris, France

[21] Appl. No.: 08/939,079

[22] Filed: Sep. 26, 1997

Related U.S. Application Data

[60] Continuation of application No. 08/643,064, Apr. 30, 1996, abandoned, which is a division of application No. 08/234,462, Apr. 28, 1994, Pat. No. 5,576,076.

[30] Foreign Application Priority Data

Apr. 29, 1993 [FR] France ................................. 93 05063

[51] Int. Cl.$^6$ ..................................................... B32B 9/06
[52] U.S. Cl. ...................... 428/450; 427/255.3; 427/579; 427/580; 428/336; 428/337; 428/412; 428/446; 428/469; 428/473.5; 428/522; 428/523; 428/688

[58] Field of Search ..................................... 428/446, 450, 428/688, 469, 336, 337, 412, 473.5, 522, 523; 427/580, 255.3, 579

[56] References Cited

U.S. PATENT DOCUMENTS 5,462,779  10/1995  Misiano et al. ...................... 427/579 X
5,670,224   9/1997  Izu et al. ............................. 427/579 X

*Primary Examiner*—Bernard Pianalto
*Attorney, Agent, or Firm*—Frommer Lawrence & Haug, LLP; William S. Frommer

[57] ABSTRACT

A product substrate coated with a uniform deposit of silicon oxide created by subjecting the substrate to an electrical discharge with a dielectric barrier in the presence of a controlled atmosphere containing a silane and an oxidizing gas, the atmosphere being at a pressure higher than 10,000 Pa, and wherein the atmosphere is maintained in the immediate vicinity of an electrode in the region where the electrical discharge is produced and further wherein any entrainment of oxygen other than that forming part of the atmosphere in the region is prevented.

20 Claims, 3 Drawing Sheets

SILICON OXIDE ON A SUBSTRATE

This application is a continuation of application Ser. No. 08/643,064, filed on Apr. 30, 1996, abandoned, which is a divisional of application Ser. No. 08/234,462, filed Apr. 28, 1994. U.S. Pat. No. 5,576,076.

1. Field of the Invention

The present invention relates to a process for the deposition of silicon oxide on a traveling solid substrate, especially a substrate made of polymeric substance, more especially a polyolefin.

Polymer films such as polyolefins are commonly employed in the packaging industry. However, these materials have surface properties which make them unsuitable for adhesion and wetting. Their low wettability, resulting from their chemical inertness, makes adhesives and inks difficult to spread.

2. Prior Art

Various industrial treatments have been developed to overcome the inadequacies of these materials. Treatments in liquid (sulfo-chromic) phase, using electrical discharge (corona or plasma discharge) or using flame may be mentioned. The special feature of these treatments is that they result in a surface oxidation of the material. Alcohol, aldehyde, ketone, carboxyl and similar functional groups can thus be created at the surface of these materials. However, a loss of the surface properties is seen to take place with time, as a result of the molecular rearrangements due to a minimization of the surface energy. The polar groups responsible for the interaction forces tend to turn back into the material. As a result, the surface partially recovers its initial composition and therefore its original properties.

It is known that the performance of polyolefin films can be improved by depositing a small quantity of silicon oxide on their surface. In particular, document WO-A-92/11312, in the name of L'Air Liquide S.A., describes a process according to which a substrate made of polymer is subjected to an electrical discharge with a dielectric barrier at a pressure above 10,000 Pa and, simultaneously or subsequently, the substrate thus treated is exposed to an atmosphere containing a silane. A deposit of silicon oxide is formed by reaction of the silane with the residual oxygen present at the surface of the substrate or in the process atmosphere, or else by post-oxidation of the silicon deposit when the substrate is put back in contact with air.

In this document it is specified that "deposit of silicon oxide" means a deposit of silicon dioxide which may also contain a silicon oxide that is substoichiometric in oxygen.

More precisely, the process just described can be implemented according to two different methods:

According to the first method, the electrical discharge treatment is carried out in the presence of air, nitrogen, oxygen, argon or of a mixture of these gases, and the surface which has been subjected to the electrical discharge is next exposed to an atmosphere containing silane diluted in an inert gas such as argon, the concentration of the silane being preferably from 0.01 to 5% by volume, the atmosphere being at atmospheric pressure and at ambient temperature.

According to the second method of implementing the process, the substrate is subjected to the electrical discharge treatment while it is in an atmosphere containing the silane, for example a mixture of nitrogen, argon and silane, and is next put back into contact with air.

It is stated that the presence of a little air in the atmosphere containing the silane may be tolerated in either of these operating methods.

The process described in this document provides an effective deposition of silicon oxide. However, the Applicant Companies have been able to ascertain that the deposition was not sufficiently uniform over the whole area of the treated substrate, and this can result in nonhomogeneous surface properties. A requirement has therefore appeared for a more complete uniformity of this deposition at the surface of the substrate. The investigations which have led to the invention showed that the route towards an improvement in uniformity was through better control of the oxygen contents of the atmosphere containing the silane.

When the treatment is performed in line (roll-to-roll), the substrate travels into a station where it is subjected to the electrical discharge and exposed to the silane atmosphere. The quantity of air (boundary layer) entrained by the substrate into the station depends directly on the speed of travel. When the speed of travel is changed, the residual oxygen content varies, as do the deposition parameters.

A poor control of the atmosphere can also result in a reaction of the silane with the oxygen in gaseous phase outside the active region with the appearance of silica particles which will deposit on the substrate or the walls of the treatment station (fouling).

SUMMARY OF THE INVENTION

The present invention is intended to solve these problems and to provide a process which makes it possible to obtain substrates which have a silicon oxide deposit that is superior in uniformity to what has been obtained hitherto.

To obtain this result, the invention provides a process for creating a deposit of silicon oxide on a traveling solid substrate, according to which the substrate is subjected to an electrical discharge with a dielectric barrier in the presence of an atmosphere containing a silane, this atmosphere being at a pressure higher than 10,000 Pa, in which an atmosphere of controlled composition, containing a silane and oxygen or a gas capable of providing oxygen, as well as a carrier gas, is circulated in the region where the electrical discharge is produced, and means are used for substantially preventing any entrainment of oxygen other than that forming part of said atmosphere in said region.

In the context of the present invention "silane" is understood to mean a compound in gaseous form under the pressure and temperature conditions used, and containing at least one silicon atom. A silane according to the invention may therefore consist of a silicon hydride of formula $Si_nH_{2n+2}$, n being an integer which is usually between 1 and 5, a halogenated silicon hydride such as $SiCl_4$, $SiH_2Cl_2$, $SiH_3Cl$, $SiHCl_3$, an alkoxysilane such as tetraethoxysilane or another organosiloxane, such as hexamethyldisiloxane.

Silicon hydrides such as $SiH_4$ or $Si_2H_6$ are preferred. $SiH_4$ is very particularly preferred.

The treatment using electrical discharge with a dielectric barrier consists in producing an electrical discharge between two electrodes, at least one of which is covered with a dielectric material such as glass, alumina or silica or, in this case, where appropriate, the substrate to be treated. Such a treatment is conventional and known per se. It may particularly consist of a luminescent discharge or "silent glow discharge," or, preferably, a corona discharge, well known per se, see, for example, the article "The flexible adaptation of the effective contact surface" by E. Prinz, published in "Plastics Southern Africa", June 1983, pages 50 et seq.

The electrical discharge with a dielectric barrier is advantageously produced at a pressure of between 50,000 and 120,000 Pa, and preferably at atmospheric pressure, the temperature being preferably the ambient or, generally, between the ambient and the melting temperature of the substrate treated.

The contact time of the substrate treated with the electrical discharge with the atmosphere containing the silane is not critical and may particularly be chosen as a function of the desired thickness of the silicon oxide deposit. By way of guidance, it may range from $10^{-3}$ second to 1 minute or longer.

The process of the invention may be performed in line with the plant for the manufacture of the substrate made of polymer (for example by extrusion or blow-extrusion), or may be carried out on a substrate manufactured and stored before treatment. The substrate may be, for example, a sheet or a film. The thickness of the substrate generally is not critical and may, for example, be between 5 $\mu$m and 2 cm, more particularly between 10 and 200 $\mu$m.

The process of the invention can be used for treating substrates made of various natural or synthetic materials as well as metal substrates, especially metal sheets such as sheets of aluminum. As natural material there may be mentioned cellulose, it being possible for the treated substrate to be then paper or cardboard. However, substrates made of synthetic polymer are preferred within the scope of the present invention. Among these, the most advantageous are made of thermoplastic material, especially polyolefin, such as polyethylene, polypropylene or polystyrene, of polyethylene terephthalate, polyamide, polyvinyl chloride or polycarbonate. Polyolefin substrates are very particularly preferred within the scope of the present invention.

The gas capable of providing oxygen must be capable of providing oxygen by decomposition under the effect of the electrical discharge; it is advantageously chosen from nitrous oxide ($N_2O$), nitrogen monoxide (NO) or carbon dioxide ($CO_2$). Water vapor ($H_2O$) or methanol ($CH_3OH$) may also be used. This list is not definitive and may include other gases or nongaseous molecules capable of supplying elemental oxygen. Another advantageous gas is simply molecular oxygen, which may be present in air or in air enriched, or depleted, in oxygen.

The carrier gas must be inert towards the silane. It may be chosen from the group consisting of nitrogen, helium, argon, neon, krypton and xenon.

According to a first embodiment a mixture containing the silane and the oxygen or the gas capable of providing oxygen is prepared in advance and this mixture is introduced into the region where the electrical discharge is produced.

It will be noted that for safety reasons the silane and the oxygen must be mixed just before being introduced into the region where the electrical discharge is produced. The mixing can therefore be performed in a delivery conduit.

According to a second embodiment the silane and the oxygen or the gas capable of providing oxygen are introduced separately into the region where the electrical discharge is produced.

The first embodiment will therefore ensure a composition of the atmosphere in the electrical discharge region which is more homogeneous than the second embodiment. On the other hand, it increases the risk of incidents due to an uncontrolled reaction between the silane and the oxygen or the gas capable of providing oxygen. It is therefore to be avoided if reactive bodies, in particular molecular oxygen, are employed. Within the context of the present invention "controlled atmosphere" means more particularly an atmosphere in which the contents of silane and oxygen or gas capable of providing oxygen, are predetermined. The silane content in this atmosphere may be between 0.01 and 5% by volume. The ratio of the flow rates of silane and of oxygen or gas capable of providing oxygen is not critical but it is preferably such that the proportion of silane is lower than the stoichiometric proportion corresponding to the production of silicon dioxide. Thus, in the case where $SiH_4$ and $N_2O$ are employed ($SiH_4/N_2O$ ratio=½ for stoichiometry), the $N_2O/SiH_4$ ratio is usually between 1 and 50, and preferably between 2 and 10.

The means which may be used to substantially prevent any entrainment of oxygen other than the oxygen which may form part of the atmosphere in the region where the electrical discharge is produced are more particularly intended to prevent the entrainment of air by the traveling substrate. These means consist especially of inertness gas-locks, suction conduits fitted with pumps or fans, or mechanical means such as brushes or rollers between which the substrate travels. These means may be arranged upstream and downstream of said region.

The speed of travel of the solid substrate is usually higher than 1 meter per minute, preferably between 30 and 800 meters per minute.

The invention further provides a device for making use of the process indicated above, and intended more particularly for the continuous treatment of a polyolefin strip. This device comprises:

an electrode or group of electrodes capable of being raised to a high electrical AC voltage in relation to a counterelectrode situated at a short distance from said electrode or group of electrodes, the substrate traveling between the electrode or group of electrodes and the counterelectrode;

a support carrying the electrode or group of electrodes and provided with one or more injection conduits arranged to convey a mixture containing silane, oxygen or a gas capable of providing oxygen and a carrier gas, or components of this mixture, and at least two suction conduits connected to another source of suction and emerging one upstream and the other downstream of the injection conduit(s) and of the electrode or group of electrodes.

The arrangement described makes it possible to avoid, or at the very least to limit to a minimum, any entrainment of air into the electrical discharge region, and thus to ensure a high stability of the controlled composition.

The device of the invention allows the injection conduits to emerge in variable and chosen places of the group of electrodes or of the space where the substrate travels, be it:

the space where the substrate travels, in the immediate vicinity of the electrode (or group of electrodes) and upstream thereof, considering the direction of travel of the substrate;

the space where the substrate travels, situated between the group of electrodes and the counterelectrode, by making these injection conduits pass through inside the group of electrodes; or else in the vicinity of the group of electrodes or within this group of electrodes.

Correspondingly to the two operating methods indicated above, provision is made for either the injection conduit(s) to be connected to a single delivery conduit for the mixture containing silane and oxygen or a gas capable of forming oxygen not reacting with the silane under the process conditions, in the absence of the electrical discharge, or for the device to comprise at least two injection conduits, one of which is connected to a source of gas containing silane and the other to a source of oxygen or of gas capable of providing oxygen, capable of reacting with said silane under the same conditions.

The type of electrode employed for making use of the invention may consist of any electrode conventionally employed for forming an electrical discharge with a dielectric barrier, of geometry giving rise to an electrode section that is, for example, circular or else square or rectangular.

Electrodes can be made of all nonoxidizing metals, such as anodized aluminum, titanium, and preferably stainless steel, or of ceramics, preferably pure $Al_2O_3$ ceramics or glass.

BRIEF DESCRIPTION OF THE DRAWINGS

The invention will now be described in greater detail with the aid of practical examples illustrated with the drawings, among which.

DESCRIPTION OF THE PREFERRED EMBODIMENT

Figure 1:
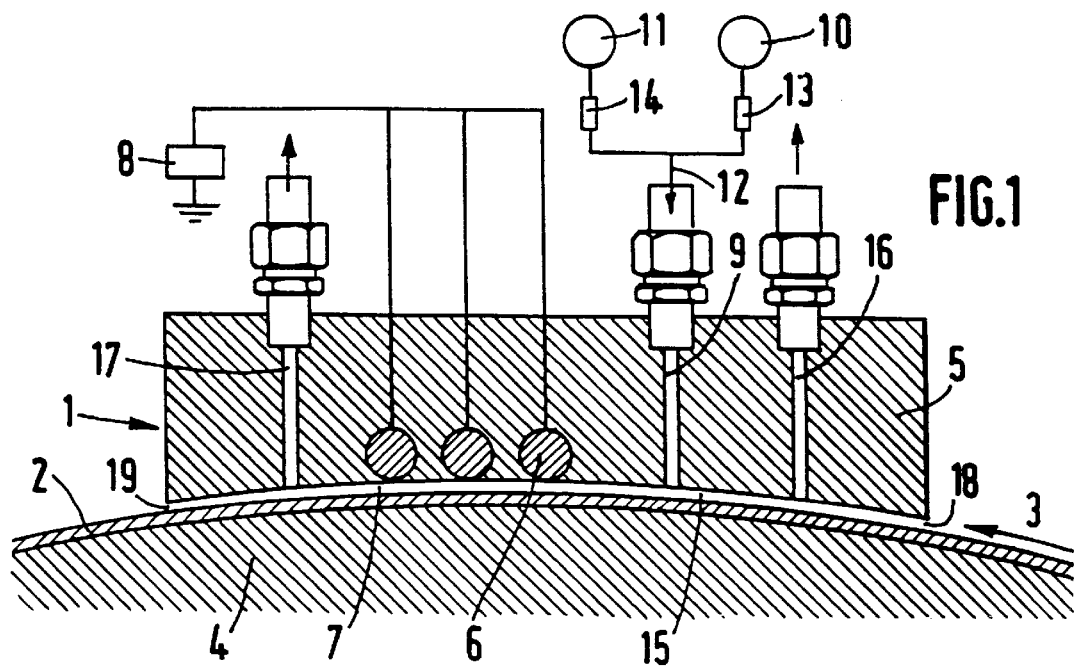
FIG. 1 is a diagrammatic view in section and in elevation of a device for processing a polyolefin strip in accordance with the invention.

FIG. 1 shows a processing device 1 through which passes for example the polyolefin strip to be treated 2, in the direction of the arrow 3.

The strip 2 is carried by a counterelectrode consisting of a drum 4 which rotates in the direction shown by the arrow 3. Above the counterelectrode 4 a support 5 is arranged, which holds the electrodes 6 so as to leave remaining between these electrodes and the counterelectrode a gap 7 of well-defined thickness, which is slightly greater than the thickness of the strip 2.

The electrodes 6 are connected to a source of very high voltage with high frequency 8, while the counterelectrode is grounded.

Passing through the support 5 is an injection conduit 9 connected to a source 10 of mixture of nitrogen, acting as carrier gas, and silane, and a source 11 of for example a mixture of $N_2O$ and of nitrogen, (or of any gas containing oxygen or capable of providing oxygen) via a common delivery conduit 12.

Means for control 13, 14 are provided for measuring and adjusting the flow rate from the sources 10 and 11.

The injection conduit 9 emerges into the gap 15 between the support 5 and the counterelectrode 4 at a short distance upstream of the electrodes 6. Upstream, like downstream, is defined with reference to the direction of travel shown by the arrow 3.

Upstream and downstream of the injection conduit 9 there emerge two suction conduits 16 and 17, which also pass through the support 5 and are connected to a suction device, not shown.

The suction conduits 16 and 17 emerge in the gap 15, the former between the point 18 where the strip 2 enters this gap and the injection conduit 9, and the latter between the electrodes 6 and the point 19 where the strip leaves the gap 15.

It should be explained here that the injection and suction conduits consist of transverse slots whose length is at least equal to the width of the strip 2. Around the electrodes 6 an atmosphere exists whose composition is extremely close to that of the gas delivered by the conduit 9. A complete uniformity of the operating conditions is thus obtained, and experience shows that an excellent uniformity of the result is also obtained.

Figure 2:
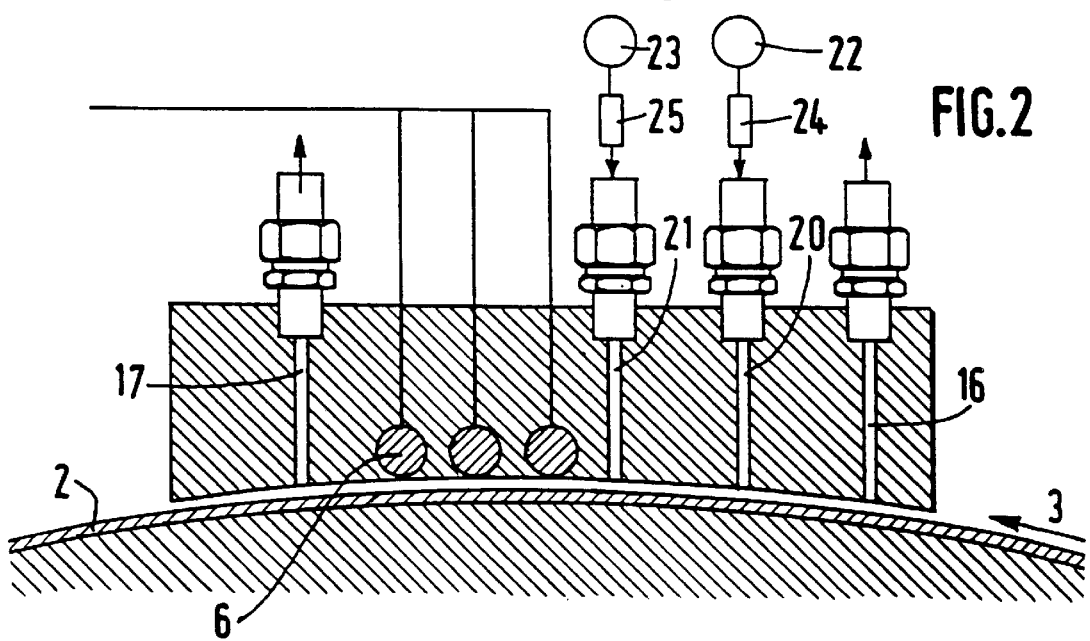
FIG. 2 is a partial view, corresponding to FIG. 1, and showing an alternative form.

FIG. 2 shows an alternative form of the arrangement described in FIG. 1. The alternative form consists essentially in the fact that the injection conduit 9 of FIG. 1 is replaced by two injection conduits 20, 21, one connected to a source 22 of a mixture of silane and of neutral gas, argon or nitrogen, and the other to a source 23 of a mixture of air, or another oxidizing gas, and of neutral gas, air or nitrogen. The respective proportions of silane and oxygen are controlled with the aid of devices 24, 25 which are inserted into the conduits 20, 21.

The two conduits 20 and 21 emerge in the vicinity of the strip 2, slightly upstream of the electrodes 6, between the suction conduits 16 and 17.

Figure 4:
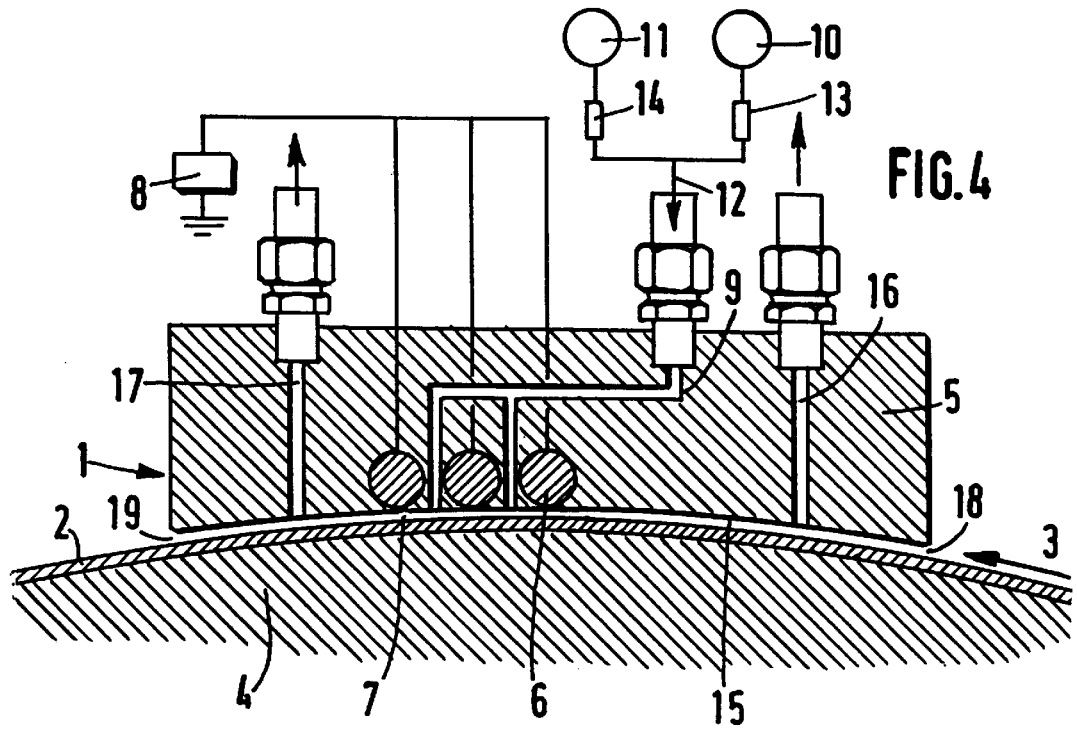
FIG. 4 is a diagrammatic representation of an alternative form of the device of FIG. 1, in which the gas mixture is introduced directly into the space between the electrode system and the counterelectrode.

FIG. 4 shows an alternative form of the device described in the context of FIG. 1, in the case of which the injection conduit 9 is here subdivided into two branches, each branch passing between two electrodes 6 to feed directly the gap 7 situated facing the electrode system.

As stated above, one alternative form of the device of FIG. 4 consists in making the conduit 9 emerge in the upper vicinity of the group of electrodes or else, for example, in making the two branches emerge between the electrodes 6.

Figure 5:
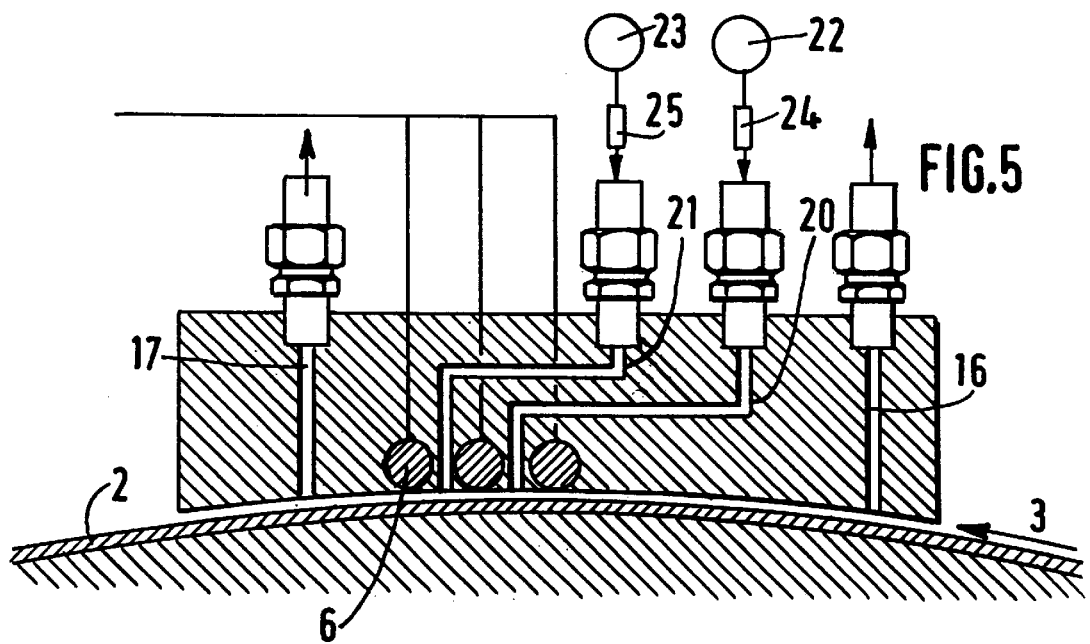
FIG. 5 is a diagrammatic representation of an alternative form of the device of FIG. 2, in which the two gas mixtures are separately introduced directly into the space between the electrode system and the counter-electrode.

FIG. 5 shows an alternative form of the device described in the context of FIG. 2, in the case of which the two injection conduits 20 and 21 here pass through inside the electrode system 6 and feed directly the gap 7 situated facing this electrode system. Here again an alternative form of the device of FIG. 5 would consist in making the conduits 20 and 21 emerge in the upper vicinity of the electrodes 6, or else between these electrodes 6.

Figure 6:
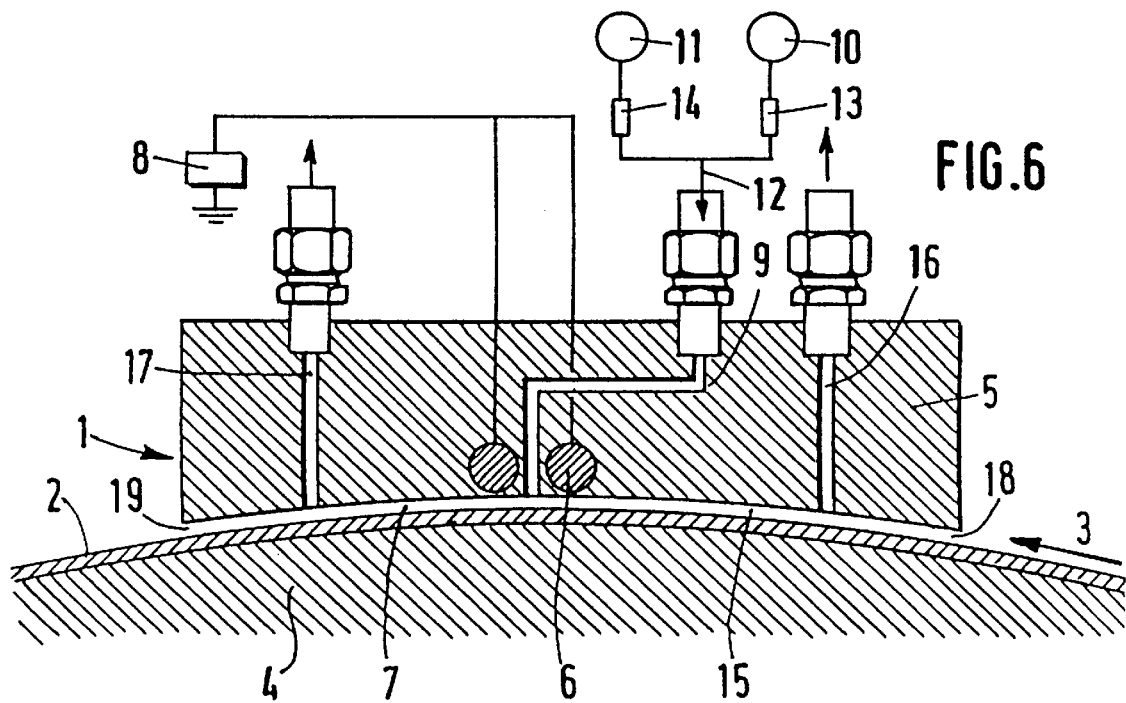
FIG. 6 shows an alternative form of the device of FIG. 4, in which the electrode system includes only two electrodes.

FIG. 6 illustrates an alternative form of the device of FIG. 4, where the electrode system 6 includes only two electrodes.

Figure 7:
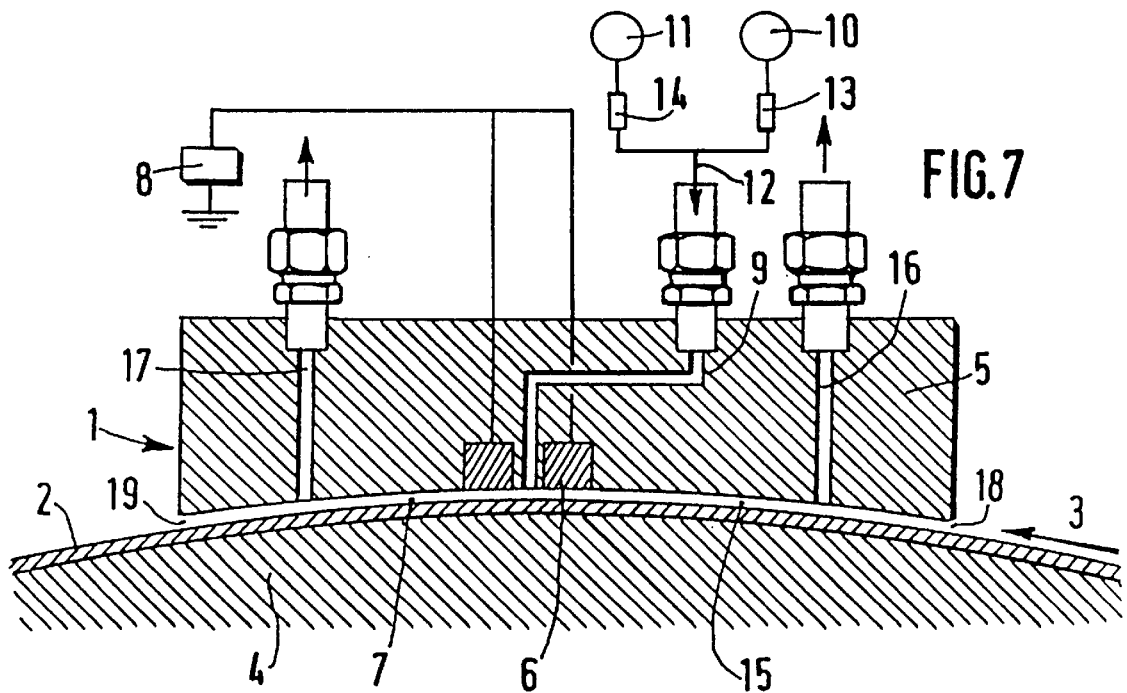
FIG. 7 shows an alternative form of the device of FIG. 6, in which the two electrodes of the system are rectangular in section.

FIG. 7 illustrates an alternative form of the device of FIG. 6, where the two electrodes 6 are rectangular in section.

Tests carried out with either of the above pieces of apparatus have made it possible to observe that, in contrast to what is suggested in the document WO-A-92/11312, the efficiency of the process decreases very strongly when a mixture of argon and silane with an extremely low oxygen content is employed.

In the absence of the provisions provided by the present invention, it appears that correct, but necessarily nonuniform, results are obtained only by virtue of the presence of air entrained by the traveling sheet.

Results of tests under the following conditions are given below:

Atmosphere in the vicinity of the electrodes 6:
composition: variable, see below;
flow rate: 10 Nl/minute;
treatment density: 40 W min/m$^2$;
speed of travel: 33 m/minute;
distance between electrode and counterelectrode: 1.5 mm;
nature of the substrate: Mobil Bicor MB 400 (registered trademark). This is a coextruded, biaxially drawn polypropylene sheet 20 micrometers in thickness and 0.3 m in width. Its initial surface tension is lower than 36 mN/m;
surface tension measurements: performed according to ASTM standard D-2578-84 on unwashed samples, immediately after the treatment. The maximum measurable value is 58 mN/m and the measurement error is estimated at ±1 mN/m.

The results of the tests are given in the table below:

| TEST | SiH$_4$ | Oxidizing agent | Neutral gas | Surface tension |
|---|---|---|---|---|
| untreated | — | — | — | <36 |
| 1 control | — | air | air | 46 |
| 2 control | 0.2% | without | N$_2$ or Ar | 54 |
| 3 invention | 0.2% | N$_2$O:0.8% | " | >58 |
| 4 invention | 0.2% | CO$_2$:0.4% | " | >58 |
| 5 invention | 0.2% | air | air | >58 |
| 6 invention | 0.5% | air | air | >58 |
| 7 invention | 0.2% | O$_2$:2% | argon | >58 |
| 8 invention | 0.2% | N$_2$O:0.8% | argon | >58 |
| 9 invention | 0.5% | N$_2$O:2.0% | argon | >58 |

In the case of Example 7 the flow rates were: argon 10 Nl/minute, oxygen 200 cm$^3$/minute.

Figure 3:
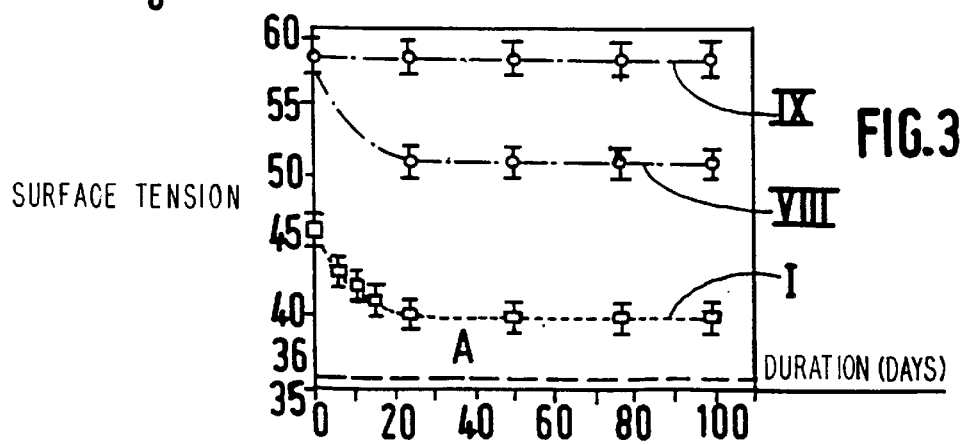
FIG. 3 is a diagram of change in surface tension as a function of time.

FIG. 3 shows the change in surface tension as a function of time. Curves I, VIII and IX correspond to the samples from tests 1 (control), 8 and 9 (in accordance with the invention) respectively. The straight line A relates to the untreated product.

It is found that control of the atmosphere in the vicinity of the electrode region permits an improvement in the surface tension and aging properties of the product.

What is claimed is:

1. A product comprising a deposit of silicon oxide on a substrate formed by a method comprising the steps of moving the substrate through an electrical discharge region; subjecting the substrate to an electrical discharge in said region in the presence of an atmosphere containing (a) a silane, (b) oxygen or a gaseous compound containing oxygen and (c) a carrier gas; maintaining said atmosphere at a pressure higher than 10,000 Pa; circulating said atmosphere in said region and preventing entrainment of oxygen other than that forming part of said atmosphere in said region, thereby forming silicon oxide on said substrate.

2. The product as claimed in claim 1, wherein said electrical discharge is created with a dielectric barrier.

3. The product as claimed in claim 1, wherein said pressure is greater than about 50,000 Pa.

4. The product as claimed in claim 1, wherein said product is in the form of a continuous sheet on a roll.

5. The product as claimed in claim 1, wherein said silane is a silicon hydride.

6. The product as claimed in claim 1, wherein said substrate comprises aluminum.

7. The product as claimed in claim 1, wherein said substrate comprises a thermoplastic material.

8. The product as claimed in claim 1, wherein said substrate comprises a polymeric material.

9. The product as claimed in claim 8, wherein said polymeric material is selected from the group consisting of polyolefin, polyethylene, polypropylene, polystyrene, polyamide, polyvinyl chloride and polycarbonate.

10. The product as claimed in claim 8, wherein said polymeric material is polyolefin.

11. The product as claimed in claim 1, wherein said substrate is a metal.

12. The product as claimed in claim 1, wherein said substrate is in the form of a sheet.

13. The product as claimed in claim 1, wherein said substrate is in the form of a film.

14. The product as claimed in claim 1, wherein said substrate has a thickness between 5 μm and 2 cm.

15. The product as claimed in claim 1, wherein said substrate has a thickness between 10 μm and 200 μm.

16. The product as claimed in claim 1, wherein said product has a surface tension greater than 58 mN/m.

17. A coated product comprising a polymeric substrate coated with a uniform deposit of silicon oxide, wherein said product has a surface tension greater than 58 mN/m.

18. The product as claimed in claim 17, wherein said uniform deposit of silicon oxide has a thickness between about 10 μm and 200 μm.

19. The product as claimed in claim 18, wherein said product is in the form of a continuous sheet on a roll.

20. The product as claimed in claim 17, wherein said polymeric material is selected from the group consisting of polyolefin, polyethylene, polypropylene, polystyrene, polyamide, polyvinyl chloride and polycarbonate.

* * * * *